United States Patent [19]
Mizushima et al.

[11] 4,142,200
[45] Feb. 27, 1979

[54] SEMICONDUCTOR PHOTODIODES

[75] Inventors: Yoshihiko Mizushima, Fuchu; Kenji Kajiyama, Kodaira; Tatsuya Kimura, Tokorozawa; Hiroshi Kanbe, Tanashi, all of Japan

[73] Assignee: Nippon Telegraph & Telephone Corp., Japan

[21] Appl. No.: 734,182

[22] Filed: Oct. 20, 1976

[30] Foreign Application Priority Data

Oct. 27, 1975 [JP] Japan ................................ 50-129630

[51] Int. Cl.² .......................................... H01L 27/14
[52] U.S. Cl. ...................................... 357/30; 357/13; 357/15; 357/89; 357/90
[58] Field of Search ...................... 357/13, 15, 30, 89, 357/90

[56] References Cited

U.S. PATENT DOCUMENTS

| | | | |
|---|---|---|---|
| 3,886,579 | 5/1975 | Ohuchi et al. | 357/13 |
| 3,921,192 | 11/1975 | Goronkin et al. | 357/13 |
| 3,959,646 | 5/1976 | de Cremoux | 357/13 |
| 3,990,099 | 11/1976 | Duigon et al. | 357/13 |
| 4,060,820 | 11/1977 | Pucel et al. | 357/13 |

FOREIGN PATENT DOCUMENTS

| | | | |
|---|---|---|---|
| 2513460 | 10/1975 | Fed. Rep. of Germany | 357/13 |
| 1147015 | 4/1969 | United Kingdom | 357/13 |

Primary Examiner—Stanley D. Miller, Jr.
Assistant Examiner—James W. Davie
Attorney, Agent, or Firm—Charles W. Helzer

[57] ABSTRACT

The impurity concentration distribution of the layers of a multilayer junction diode is varied such that the concentration in a first region contiguous to the junction is low, in a second region is high, in a third region is low and in a last region gradually increases in the direction away from the junction.

9 Claims, 35 Drawing Figures

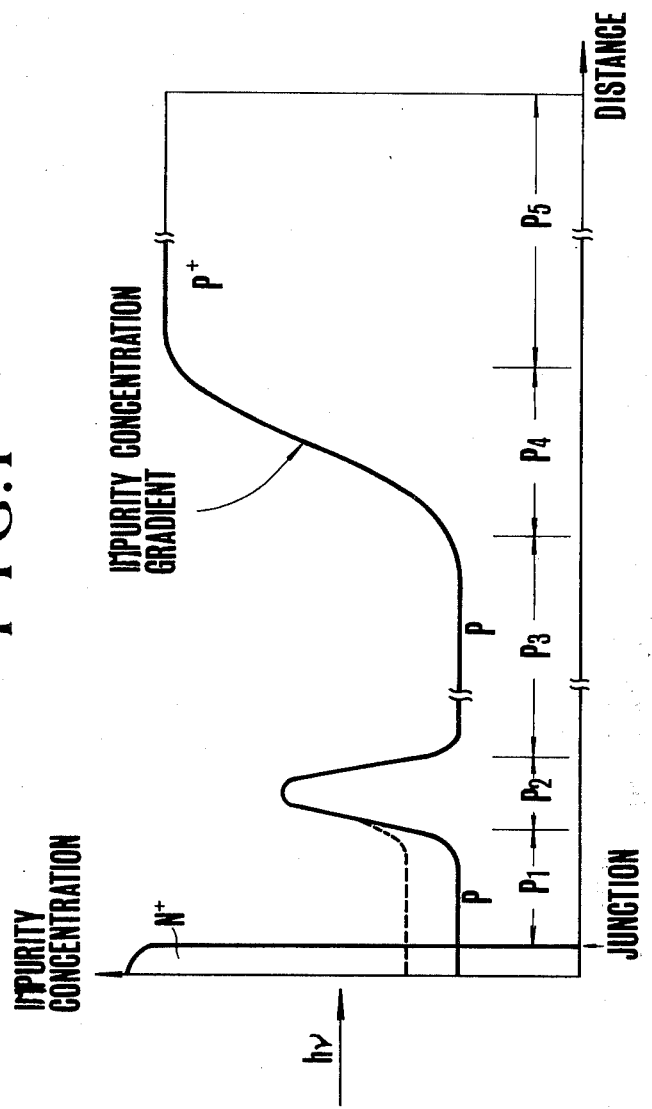

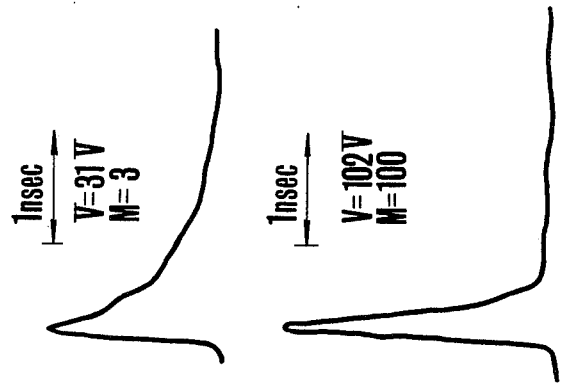
FIG. 11 A
FIG. 11 B
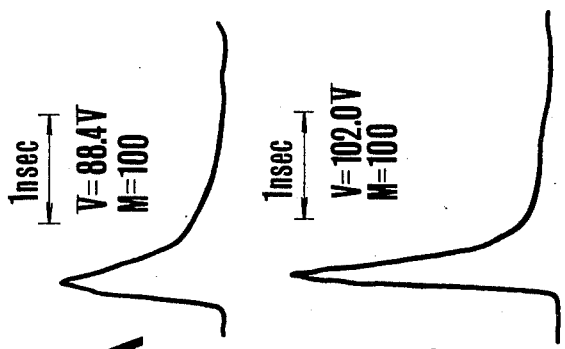
FIG. 12 A
FIG. 12 B

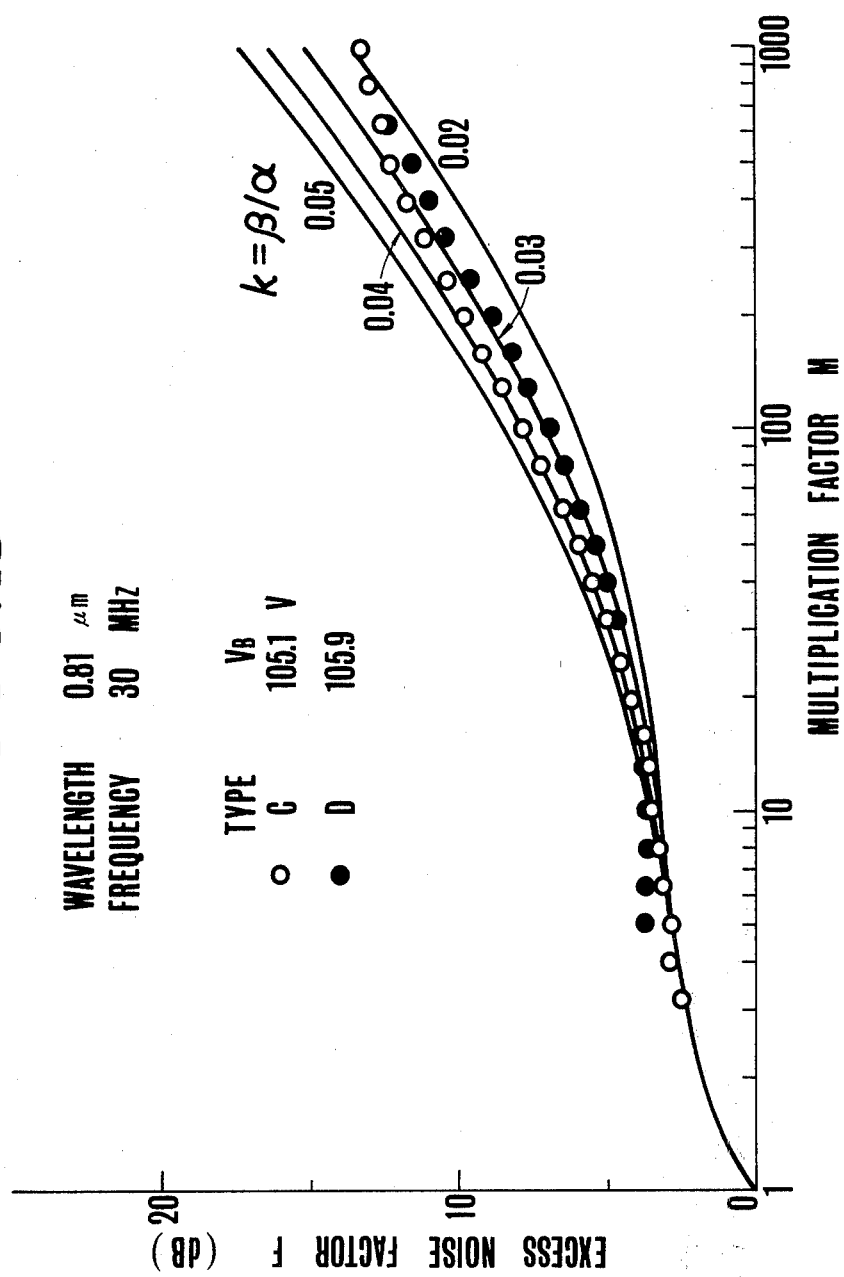

SEMICONDUCTOR PHOTODIODES

BACKGROUND OF THE INVENTION

This invention relates to a semiconductor photodiode more particularly a semiconductor junction photodiode wherein a sufficiently high reverse bias voltage is applied across the junction for the purpose of utilizing the avalanche multiplication phenomena of the carriers and a method of manufacturing such photodiode.

In recent years various technology have been developed for effecting optical fiber transmission. With regard to an optical detector utilized to detect optical signals transmitted through optical fibers, it has been strongly desired to obtain an improved semiconductor photodiode which is suitable to be compatible with the optical fibers small size and having a high sensitivity and high operating speed. An avalanche photodiode (APD) made up of silicon has been used for fulfilling those requirements. However, since it has been found that a wavelength band of from 0.8 to 0.9 $\mu$m is suitable for the low loss region of the optical fibers as well as the oscillation possible region of AlGaAs semiconductor lasers, the use of a conventional Si-APD presents the following problems. More particularly, the absorption coefficient of Si decreases in the wavelength bands from 0.8 to 0.9 $\mu$m and received light reaches deep portions in the APD. Since the photocarriers formed by the light arriving at the deep portions migrate by diffusion, they arrive at the junction with a time lag thus decreasing response speed. Such decrease in the absorption coefficient decreases the quantum efficiency. For this reason according to a prior art design it has been necessary to apply high bias voltages of 200 to 400 volts, for example, in order to improve the response speed and the quantum efficiency. Further, after the electric field dependency of the ionization coefficient upon the electrons and holes in silicon has been clearly analyzed a method of designing an avalanche region utilizing such data has become possible. Thus, with reference to silicon, when the avalanche multiplication is effected in a low electric field region, the ionization coefficient ratio of the holes and electrons decrease thereby decreasing the noise formed during the avalanche multiplication process. Such expectation for low noise resulted in a strong request for improvement of the quantum efficiency, response speed and the operating voltage.

Considering the above described APD, when the width of the depletion layer formed in the interior of the diode is increased it is possible to correspondingly increase the quantum efficiency, that is the optical to electrical signal conversion efficiency. But in order to increase the width of the depletion layer it is necessary to correspondingly increase the reverse bias voltage applied to the junction or diode. Further, in order to apply such high reverse bias voltage to the junction it is necessary to increase the specific resistances or resistivity of respective regions where the depletion layer is formed, which results in an increase of the internal resistance of the diode.

When the received light penetrates deeply into the APD as described above, carriers are formed by the light that reached regions other than the depletion layer and such carriers diffuse to reach the depletion layer and superpose upon the current component formed by the light that has reached the depletion layer. The transit time of the carriers in the depletion layer is extremely short because, due to high electric field in the depletion layer, the carriers reach high field regions near the junction in a short time and at a high saturation speed ($10^6$–$10^7$ cm/sec) thus undergo avalanche multiplication. On the other hand, in the regions other than the depletion layer where electric field is not impressed, the carriers formed in these regions migrate towards the depletion layer due to the diffusion effect. For this reason, the time required for the carriers in the regions other than the depletion layer to reach the depletion layer is relatively long with the result that the current will continue to flow after end of the received light pulse. This degrades the response characteristic of the diode.

SUMMARY OF THE INVENTION

Accordingly, it is an object of this invention to provide an improved semiconductor photodiode utilizing the avalanche multiplication phenomena and having a higher quantum efficiency, faster response speed and better noise characteristics than the prior art semiconductor photodiodes and yet is capable of operating at a relatively low operating voltage.

Another object of this invention is to provide a novel method of manufacturing an improved photodiode having excellent operating characteristics.

According to one aspect of this invention there is provided a semiconductor photodiode of the type including a junction between regions containing impurities of different conducitivity types and wherein photoelectric conversion is effected by utilizing the avalanche multiplication phenomena of carriers, characterized by a first region contiguous to the junction region and containing a first conductivity type impurity at a relatively low concentration; a second region contiguous to the first region on the side thereof opposite the junction, said second region containing the first conductivity type impurity at a relatively high concentration; a third region contiguous to the second region on the side thereof opposite the first region and containing the first conductivity type impurity, the impurity concentration in the third region gradually increasing from the value of the impurity concentration lower than that of the second region; and a fourth region contiguous to the third region on the side thereof opposite the second region and containing the first conductivity type impurity at a relatively high concentration.

According to another feature of this invention there is provided a method of manufacturing a semiconductor photodiode comprising the steps of preparing a semiconductor substrate containing an impurity of a first conductivity type at a relatively high concentration; epitaxially forming a first layer on the substrate, the first layer containing the first conductivity type impurity as a relatively low concentration; heat treating the resulting assembly for forming an impurity concentration gradient extending from the substrate toward the first layer; and implanting ions into the first layer to form therein a second layer containing the first conductivity type impurity at a relatively high concentration; and forming a junction contiguous to the first layer, thereby completing the semiconductor photodiode.

According to still another aspect of this invention there is provide a method of manufacturing a semiconductor photodiode comprising the steps of preparing a semiconductor substrate containing a first conductivity type impurity at a relatively high concentration; epitaxially forming a first layer containing the first conductivity type impurity at a relatively low concentration on the substrate; heat treating the resulting assembly to form an impurity concentration gradient extending from the semiconductor substrate toward the first layer; implanting ions into the first layer to form a second layer containing the first conductivity type impurity at a relatively high concentration; epitaxially forming on the first layer a third layer containing the first conductivity type impurity at a relatively low concentration, and forming a junction contiguous to the third layer, thereby completing the semiconductor photodiode.

BRIEF DESCRIPTION OF THE DRAWINGS

Other objects and advantages of the invention can be more fully understood from the following detailed description taken in conjunction with the accompanying drawings in which:

FIG. 1 is a characteristic curve showing one example of the impurity concentration distribution of a semiconductor photodiode embodying the invention.

FIGS. 11A and 11B show pulse response waveforms of a prior art photodiode not having an impurity concentration gradient and the photodiode embodying the invention;

FIGS. 12A and 12B show pulse response waveforms for different impressed voltage upon the photodiode of this invention and FIG. 13 shows excess noise factor-multiplication factor characteristics of the photodiode of this invention in which calculated values and measured values are shown for comparison.

DESCRIPTION OF THE PREFERRED EMBODIMENTS

FIG. 1 shows one example of the impurity concentration distribution of a semiconductor photodiode embodying the invention wherein the abscissa represents the distance in the direction of the thickness of the diode, and the ordinate the impurity concentration. It should be understood that FIG. 1 is depicted not to scale for the purpose of easy understanding of the invention. As shown the $N^+$ layer is doped with a N type impurity at a high concentration to a depth of 0.3 microns. Contiguous to the $N^+$ layer is formed a $P_1$ layer or zone containing a P type impurity at a relatively low concentration i.e. $7 \times 10^{14} - 3 \times 10^{15}$ cm$^{-3}$). Next to the $P_1$ layer is formed a $P_2$ region or zone containing a P type impurity at a high concentration (i.e. about $1 \times 10^{16}$ cm$^{-3}$ peak value) followed by a $P_3$ region or zone containing a P type impurity at a relatively low concentration which is comparable to that of region $P_1$. Next to the $P_3$ region is formed a $P_4$ region or zone in which the P type impurity concentration increases relatively gradually or having an impurity concentration gradient followed by a $P_5$ region or zone in which is doped a P type impurity at a high and constant concentration.

Figure 2:
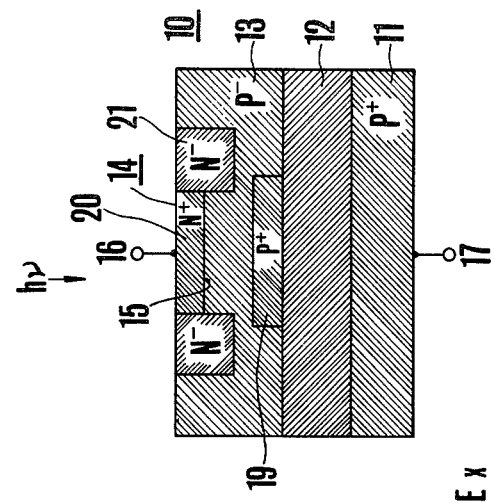
FIG. 2 is a graph showing an electric field distribution corresponding to the impurity concentration distribution shown in FIG. 1.

With the impurity concentration distribution described above it is possible to obtain an electric field distribution as shown in FIG. 2 when a sufficiently high reverse bias voltage is impressed across the semiconductor photodiode, in which the abscissa shows distance whereas the ordinate the electric field intensity. FIG. 2 is also depicted diagrammatically not in scale. As can be noted from FIG. 2 the depletion layer field is the $P_1$ region and has a sufficiently high intensity of more than $10^5$ V/cm, more preferably 3 to $5 \times 10^5$ V/cm, enough to effect avalanche multiplication. More particularly, with an impurity concentration distribution as described above the $P_1$ region which forms a PN junction together with the $N^+$ layer is connected to the $P_3$ layer through the $P_2$ region having a high impurity concentration so that the electric field intensity is rapidly decreased by the $P_2$ region. The decrease in the field intensity is determined by the concentration of the P type impurity in the $P_2$ region and the width thereof.

Furthermore, the impurity concentration gradient in the region $P_4$ creates a built-in field having an intensity of about $10^2$ to $10^3$ V/cm. The carriers formed in the region $P_4$ in which the built-in electric field is present are accelerated by the field so that they can reach the depletion layer in a shorter time than the carriers migrating under diffusion effect as in the prior art photodiode.

For this reason, by combining the impurity concentration distribution (hereinafter termed a low-high-low distribution) near the junction and the impurity concentration gradient as a portion remote from the junction as shown in FIG. 1 it is possible to obtain a semiconductor photodiode capable of decreasing the applied voltage without impairing the photoelectric converting efficiency, that is the quantum efficiency, and the response speed.

Even when the impurity concentration distribution is made as shown in FIG. 1 according to this invention since it is possible to design the noise characteristic independently of the width of the depletion layer an improved semiconductor photodiode can be obtained that can operate with low applied voltage and having low noise characteristic, as will be described later in more detail.

Figure 3:
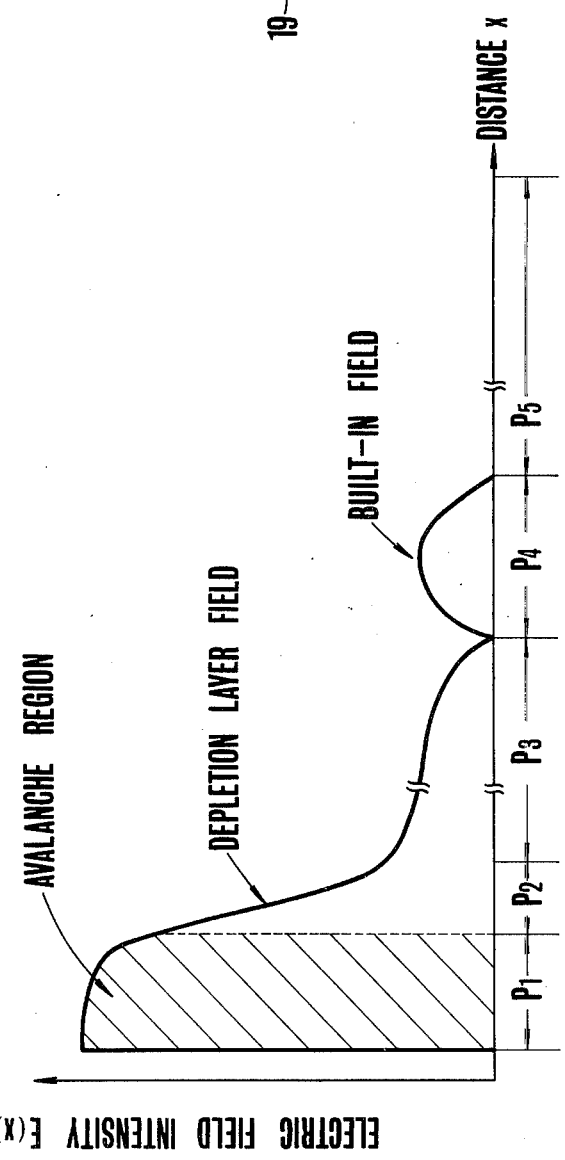
FIG. 3 is a sectional view showing the construction of a semiconductor photodiode embodying the invention.

FIG. 3 shows one example of the construction of a semiconductor photodiode embodying the invention. For the purpose of simplifying the drawing electrodes are not shown. The photodiode 10 shown in FIG. 3 comprises a P type semiconductor substrate 11 made of silicon, a P type semiconductor layers 12 and 13 overlying the substrate 11, and an $N^+$ type semiconductor layer 14. A PN junction manifesting a diode characteristic is formed between the semiconductor layers 13 and 14 and lead wires 16 and 17 are connected to the semiconductor substrate 11 and the semiconductor $N^+$ region 14, respectively. The construction described above is similar to that of a conventional diode but the diode of this invention is characterized in those various parts have the impurity concentration distribution shown in FIG. 1. More particularly, the P type semiconductor substrate 11 corresponds to the region $P_5$ shown in FIG. 1 and has a sufficiently high concentration of a P type impurity which is uniform over the entire region. This region is usually designated by $P^+$. The semiconductor layer 12 contiguous to the substrate 11 corresponds to the regions $P_4$ and $P_3$ shown in FIG. 1, and its surface in contact with the substrate 11 has an impurity concentration substantially the same as that of the substrate 11 and the impurity is diffused such that its concentration decreases gradually from that surface toward the semiconductor layer 13.

The semiconductor layer 13 is a layer generally designated as $P^-$ and contains a P type impurity at a relatively low concentration over the entire portion thereof. A P type impurity region 19 containing the P type impurity at a relatively high concentration is formed on the surface contacting the semiconductor layer 12. The region 19 corresponds to the region $P_2$ shown in FIG. 1, and the semiconductor layer 13 located between the P type region 19 and the semiconductor layer 14 corresponds to the region $P_1$ shown in FIG. 1. The semiconductor layer 14 is formed in the semiconductor layer 13 by diffusion and constituted by an $N^+$ region 20 having a sufficiently high concentration of an N type impurity and forming a PN junction between it and the semiconductor layer 13, and $N^-$ region 21 formed in the semiconductor layer 13 to surround the region 20 and having a depth larger than the region 20 and containing an N type impurity at a relatively low concentration. The $N^-$ region 21 is used as a guard ring for preventing local insulation breakdown at the edge portion of the junction.

When a bias source is connected across lead terminals 16 and 17 so as to impress a reverse bias voltage across the PN junction, an incident light hv impinge upon the semiconductor layer 14, for example, creates current to be described later across terminals 16 and 17.

While the depletion layer extends from the PN junction in the vertical direction, when viewed from the side of the PN junction 15, since the impurity concentration in the semiconductor layer 13 is lower than in the semiconductor layer 14, the depletion layer substantially extends on the side of the semiconductor layer 13 and contains the PN junction. Although the width of the depletion layer varies depending upon the bias voltage, the bias voltage is determined such that the depletion layer field contains at least the P type region 12 and continuous with the built-in field. Since the region contiguous to the PN junction has a low-high-low concentration distribution it is possible to induce electric field sufficient to effect the avalanche multiplication by a relatively low impressed voltage and to prevent inducing an excess field.

Accordingly, among the received light, the light reaching the depletion layer creates carriers therein thus passing current between terminals 16 and 17 in a manner well known in the art.

However, the carriers created by the light reaching the semiconductor layer 12 remote from the depletion layer are accelerated by the build-in field induced by the impurity concentration gradient which gradually decreases toward the PN junction 15 from the semiconductor layer 12 to reach the depletion layer in a short time. According to this invention a much greater number of carriers reach the depletion layer than those attracted to the depletion layer by the well known diffusion effect. Because the time required for the most of the carriers created in a portion remote from the depletion layer to reach the depletion layer by the well known diffusion effect is longer than the life time of the minority carriers, the carriers extinguish before they reach the depletion layer, whereas according to this invention since the build-in field is used the carriers are accelerated to higher speed than by the diffusion effect with the result that a greater number of the carriers can reach the depletion layer within their life time.

FIGS. 4A through 4F show successive steps of one example of the method of manufacturing an avalanche photodiode of this invention, and FIG. 5A through FIG. 5E shows the impurity concentration distributions at the steps of FIG. 4A through FIG. 4E wherein the abscissa represents the impurity concentration and the ordinate the distance in the direction of the thickness of the diode.

Figure 4A:
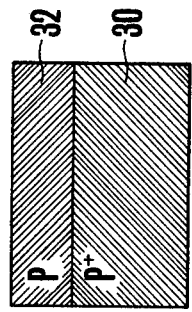
FIGS. 4A through 4F show successive steps of manufacturing a semiconductor photodiode according to the method of this invention.
Figure 5A:
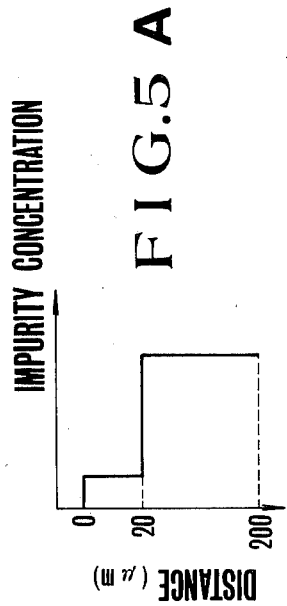
FIGS. 5A through 5E are graphs showing the impurity concentration distribution corresponding to the steps shown in FIGS. 4A through 4E.

At first a P type silicon semiconductor substrate 30, or a $P^+$ layer having a sufficiently low specific resistance ($\rho = 0.01$–$0.1$ ohm-cm), an impurity (boron) concentration of $10^{18}$ –$10^{19}$ cm$^{-3}$ and a thickness of 180 microns is prepared and an epitaxially grown P type layer 32 having an impurity (boron) concentration of $7 \times 10^{14}$ cm$^{-3}$ specific resistance $\rho = 20$ ohm-cm and a thickness of 20 microns is formed on one surface of the substrate 30. This step is shown in FIG. 4A and its impurity concentration distribution is shown in FIG. 5A. The P type layer 30 corresponds to the $P_5$ region shown in FIG. 1.

Figure 4B:
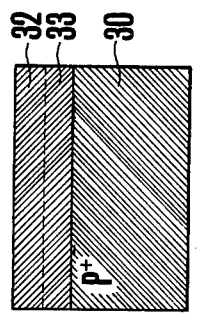
Figure 5B:
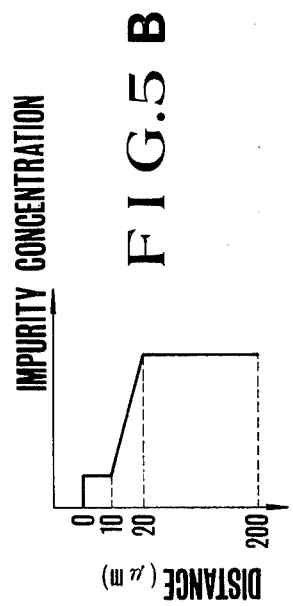

Then the semiconductor substrate 30 is heat-treated at a temperature of 1150° C. for 4 to 9 hours to diffuse the impurity in the $P^+$ layer 30 into the P type layer 32 thus forming graded concentration layer 33 having a thickness of about 10 micron, in which the concentration of the P type impurity decreases gradually from the $P^+$ layer 30 toward the P type layer 32 as shown in FIG. 4B, the graded concentration layer 33 corresponding to the region $P_4$ shown in FIG. 1. This step is shown in FIG. 4B and the impurity concentration distribution at this step is shown in FIG. 5B.

Figure 4C:
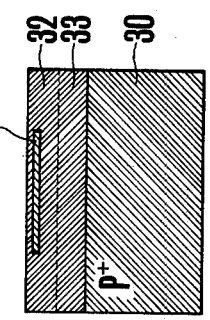
Figure 5C:
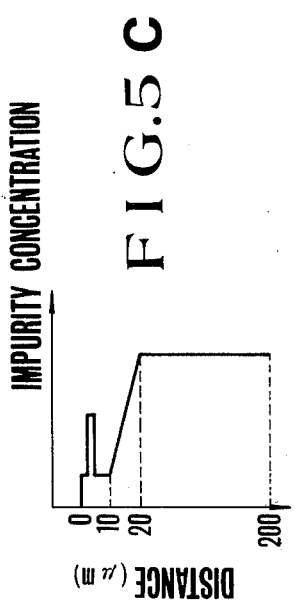
Figure 5D:
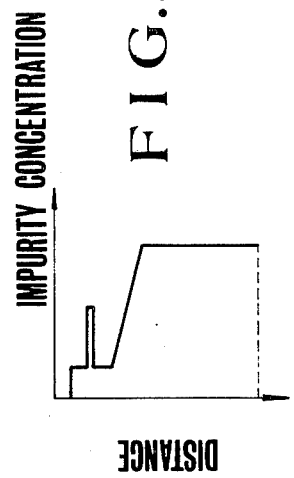

Then $B^{++}$ ions are implanted into the P type layer 32 from above at an acceleration energy of 400 keV, and the amount of dose of boron is $1.4 - 1.8 \times 10^{12}$ cm$^{-2}$. The depth of the ion implantation is about 0.8 micron. After the ion implantation, the substrate is heat-treated at a temperature of 950° C. for 3 minutes to activate the ions thus forming in the P type layer 32 a P type layer 34 having a high impurity concentration as shown in FIG. 4C. The impurity concentration distribution of the layer 34 is shown in FIG. 5C.

Figure 4D:
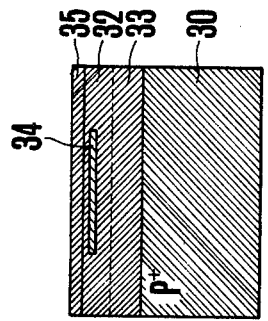

Then a P type silicon layer 35 is formed on the P type layer 32 by epitaxial growth technique wherein boron is added to the layer 35 as an impurity. The P type layer 35 has an impurity concentration of $7 \times 10^{14} - 3 \times 10^{15}$ cm$^{-3}$. In this example the impurity concentration is $7 \times 10^{14}$ cm$^{-3}$, and the thickness of the layer 35 is 2 to 3 microns. This step is shown in FIG. 4D and the impurity concentration distribution in FIG. 5D. This step is performed for the purpose of forming the P type layer 34 at a suitable distance from the junction. Where the distance is maintained constant the breakdown voltage of the diode is determined by the amount of dose, and the multiplication noise (shot noise) decreases with the increase of this distance.

Then phosphor ions are implanted from above the P type layer 35 to form an N$^-$ annular layer 36 in the P type layer 35, the layer 36 having the same or a slightly larger inner diameter as the outer diameter of the P type layer 34. The depth of the N$^-$ annular layer 36 is more than one micron and in FIG. 4E its thickness is larger than the depth of the P type layer 34. The dose of the impurity necessary to form the N$^-$ annular layer 36 is $3 - 6 \times 10^{12}$ cm$^{-2}$ and the layer 36 is formed by heat-treating at a temperature of 950° C. for 9 hours for effecting diffusion after the ion implantation. The annular layer 36 acts as a guard ring for the layer 34.

Figure 4E:
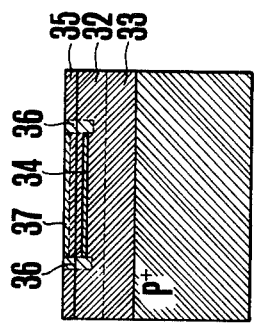
Figure 5E:
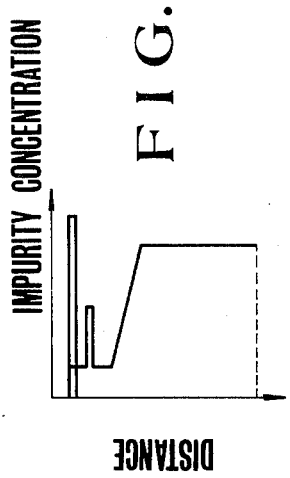

Then an N type impurity, phosphor for example, is diffused into a portion surrounded by the annular layer 36 to form a concentration of $10^{19}$ to $10^{20}$ cm$^{-3}$ thus forming an N$^+$ layer 37. The diffusion temperature is 950° C., and the thickness of the layer 37 is 0.3 micron. This step is shown in FIG. 4E and the impurity concentration distribution is shown in FIG. 5E. In FIG. 5E, the impurity concentration distribution of the annular layer is not shown.

Figure 4F:
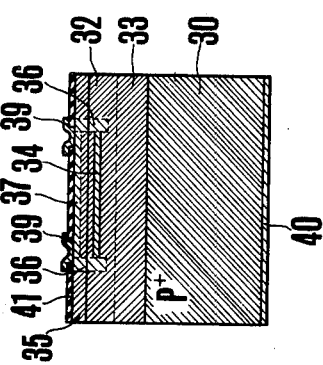

Then an insulating film 41 consisting of a SiO$_2$ film or Si$_3$N$_4$ film having a thickness of above 0.3 micron is formed on the main surface constituted by the P type layer 35, the annular layer 36 and the N$^+$ layer 37 by a well known method, and then an annular aluminum film having a diameter of 150 microns is vapour deposited on the main surface to form an electrode 39. At the same time aluminum is vapour-deposited on the bottom surface of the substrate 30 to form an electrode 40. This state is shown in FIG. 4F. Since the insulating film 41 is used to act as an antireflection film for the incident light, its thickness is varied in accordance with the wavelength $\lambda$ of the incident light.

FIGS. 6A through 6E show another method of manufacturing the avalanche photodiode of this invention and FIGS. 7A through 7D show the impurity concentration distribution at successive steps shown in FIGS. 6A through 6D. In FIGS. 7A through 7D, the abscissa represents the impurity concentration and the ordinate the distance in the direction of the thickness of the photodiode.

Figure 6:
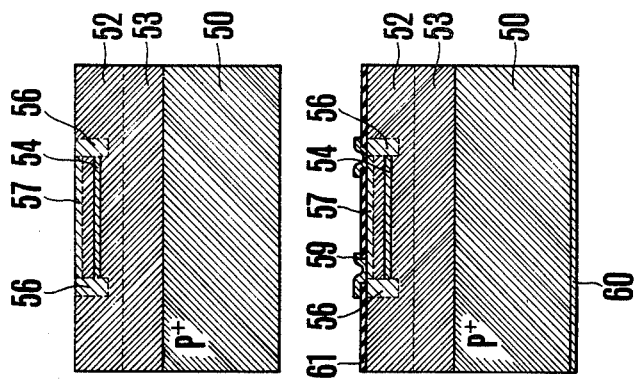
FIGS. 6A through 6E show successive steps of a modified method of manufacturing a semiconductor photodiode.
Figure 6:
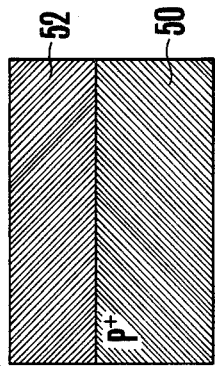
Figure 6:
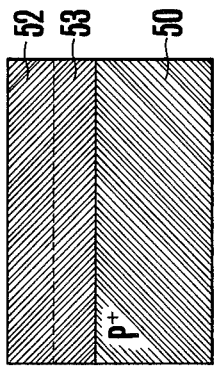
Figure 6:
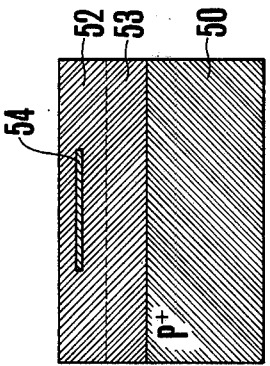
Figure 7:
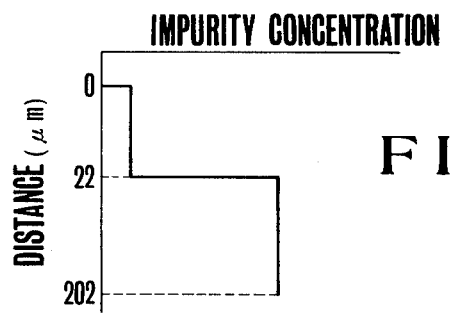
FIGS. 7A through 7D are graphs showing the impurity concentration distribution corresponding to the steps shown in FIGS. 6A through 6D.
Figure 7:
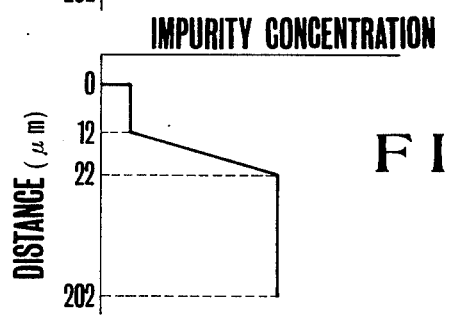
Figure 7:
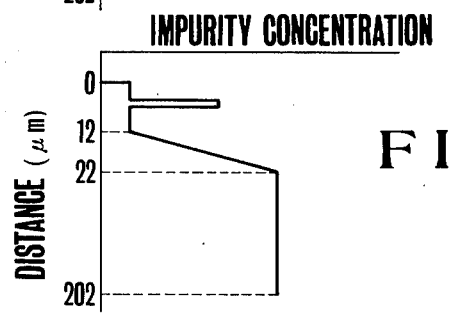
Figure 7:
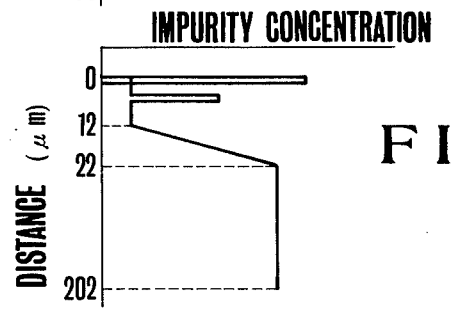

At first, a P type silicon semiconductor substrate or a P$^+$ layer 50 having a sufficiently low specific resistance ($\rho = 0.01 - 0.1$ ohm-cm) and a thickness of 180 microns, and containing an impurity (boron) at a concentration of $10^{18} - 10^{19}$ cm$^{-3}$ is prepared and an epitaxially grown P type layer 52 having an impurity concentration of $7 \times 10^{15}$ cm$^{-3}$, a specific resistivity $\rho = 20$ ohm-cm and a thickness of 22 microns is formed on one surface of the substrate 50 as shown in FIG. 6A. The impurity concentration distribution is shown in FIG. 7A. The P$^+$ layer 50 corresponds to the region P$_5$ shown in FIG. 1.

Then the semiconductor substrate 50 is heat-treated at a temperature of 1150° C. for 4 to 9 hours to diffuse the impurity in the P$^+$ layer 50 into the P type layer 52 to form a concentration graded layer 53 having a thickness of about 10 microns and in which the concentration of the P type impurity decreases gradually from the P$^+$ layer 50 to the P type layer 52 as shown in FIG. 7B. The graded concentration layer 53 corresponds to the region P$_4$ shown in FIG. 1 and the impurity concentration distribution thereof is shown in FIG. 7B.

Then ions of B$^{++}$ are implanted from above into the P type layer 52 at an acceleration energy of 1 MeV. The dose of boron is 1.4 to $1.8 \times 10^{12}$, and the depth of ion is about 2 microns. After the ion implantation the assembly is heat-treated at a temperature of 950° C. for 3 minutes to activate the ions. Thus, as shown in FIG. 6C, a P type layer 54 having a high impurity concentration is formed in the P type layer 52, and the impurity concentration distribution of the layer 54 is shown in FIG. 7C. By the steps described above, steps corresponding to those up to the step shown in FIG. 4D are performed without using again the epitaxial growth step.

Then, by implanting ions into the P type layer 52 from above to form therein an N$^-$ annular layer 56 having an inner diameter the same or slightly larger than the diameter of the P type layer 54. The N$^-$ annular layer 56 has a thickness of more than 1 micron and in FIG. 6D is shown to have a larger depth than the P type layer 54. The dose of the impurity doped to form the N$^-$ annular layer 56 is $3$ to $6 \times 10^{12}$ cm$^{-2}$. After the ion implantation the assembly is heat-treated at a temperature of 950° C. for 9 hours, the ions are diffused to form the annular layer 56 which is used as a guard ring.

Then an N type impurity, for example, phosphor is diffused into the portion surrounded by the annular layer 56 at a concentration of $10^{19}$ to $10^{20}$ cm$^{-3}$ to form an N$^+$ layer 57, as shown in FIG. 6D. The diffusion is carried out at a temperature of 950° C. for 2 minutes. The layer 57 has a thickness of 0.3 micron and the impurity concentration distribution thereof is shown in FIG. 7D in which the impurity concentration distribution of the guard ring 56 is not shown.

Then an insulating film 61 consisting of SiO$_2$ film or a Si$_3$N$_4$ film having a thickness of about 0.3 micron is applied on the main surface comprising the P type layer 52, annular layer 56 and N$^+$ layer 57 in a manner well known in the art. Thereafter, an annular shaped aluminum film having a diameter of 150 microns is vapour-deposited onto the main surface 60 and at the same time an aluminum film is also vapour-deposited on the bottom surface of the substrate to form electrode 59 and 60, as shown in FIG. 6E.

Figure 8:
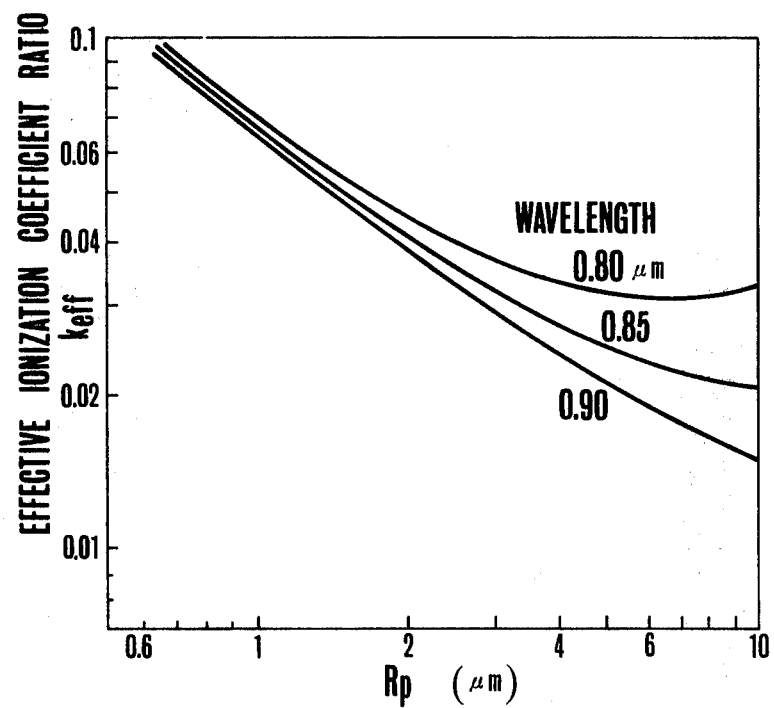
FIG. 8 is a graph showing the relationship between a parameter $k_{eff}$ representing a noise characteristic, and the distance $R_p$ between the impurity peak in a $P_2$ region and the P-N junction.

In the two examples of the method of this invention discribed above, the distance R$_p$ between the peak of the impurity concentration in the region P$_2$ having a high impurity concentration and the P-N junction was 2 microns in each case. This value R$_p$ is intimately related to the noise characteristic and the relationship between a parameter k$_{eff}$ (the ratio of effective ionizations of electrons and holes) and R$_p$ is shown in FIG. 8. The parameter k$_{eff}$ varies depending upon wavelength and in FIG. 8 the k$_{eff}$s for wavelengths 0.8, 0.85, and 0.9 microns are shown. This wavelength dependency is caused by the fact that since the absorption coefficient of silicon varies, the rate of the light absorbed in the region P$_1$ in which the avalanche multiplication occurs depends upon the wavelength so that the number of the electron-hole pairs created in this region increases as the wavelength decreases. From FIG. 8 it can be noted that in order to realize a low noise characteristics the $R_p$ should be larger than at least 1 micron.

Although in FIGS. 4A through 4F, the impurity concentration in the region $P_1$ was the same as that in the region $P_3$, as will be described hereinafter, to obtain optimum noise characteristic, the impurity concentration in the region $P_1$ may be made to be higher than that in the region $P_3$. For example, the impurity concentration in regions $P_3$ and $P_1$ may be $7 \times 10^{14}$ cm$^{-3}$ and $3 \times 10^{15}$ cm$^{-3}$, respectively. Such impurity concentration distribution is shown by dotted lines in FIG. 1.

The characteristics of a prior art semiconductor photodiode and of a semiconductor photodiode embodying the invention will now be compared with reference to FIGS. 9A through 9D and FIGS. 10A and 10B.

Figure 9:
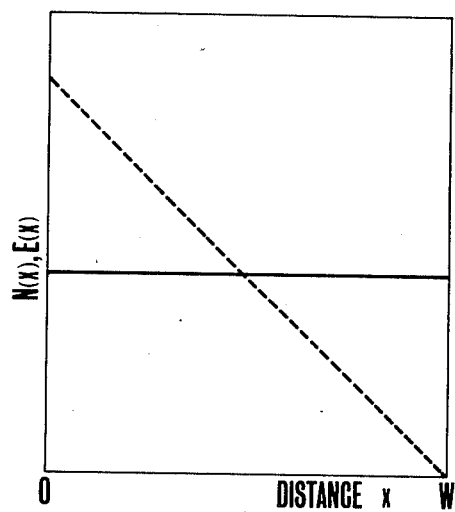
FIGS. 9A through 9D are graphs showing the impurity concentration distributions and the electric field distributions in the depletion layer of a prior art semiconductor photodiode and those of this invention, these characteristics being determined by calculation and depicted to follow a model.
Figure 9:
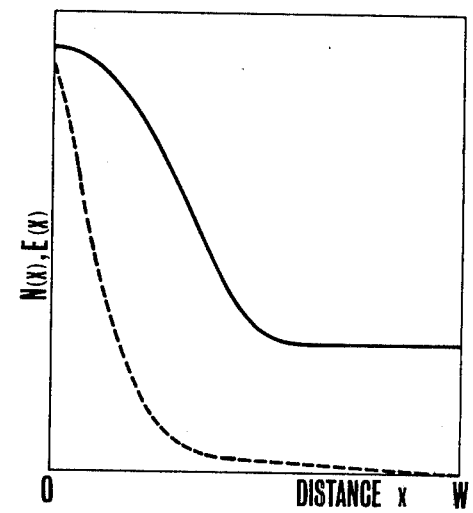
Figure 9:
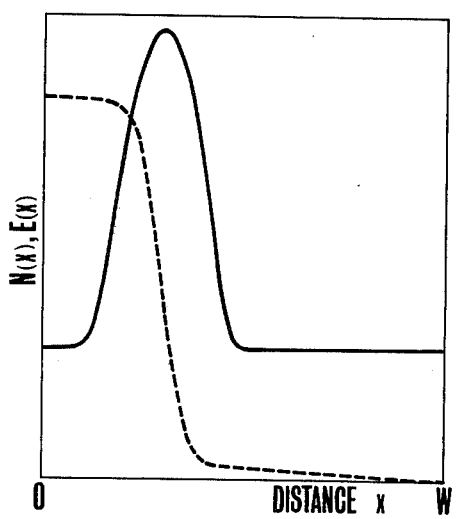
Figure 9:
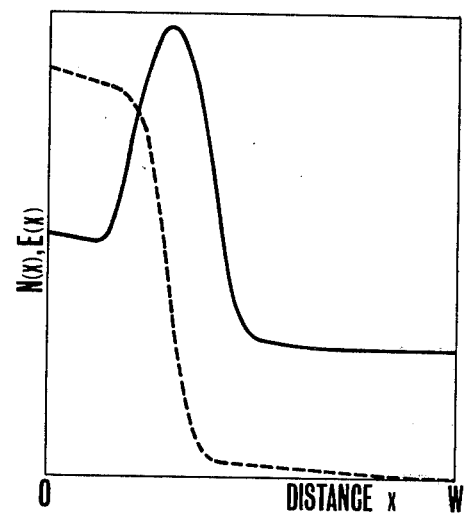

FIGS. 9A through 9D show the relationship between the impurity concentration distribution N(x) obtained by calculation and the corresponding depletion layer electric field distribution E(x) in which FIG. 9A shows the characteristic of a prior art diode having a constant impurity concentration, FIG. 9B shows the relationship between the impurity concentration distribution and the electric field distribution of a prior art diode having so-called hyperabrupt junction whereas FIGS. 9C and 9D show the relationship between the impurity concentration distribution and the elecfric field distribution of the novel photodiode of this invention. More particularly, FIG. 9C shows the characteristic of the diode having an impurity concentration distribution as shown in FIG. 1 and FIG. 9D the characteristic of the diode in which the impurity concentration in region $P_1$, FIG. 1, is made to be higher than that in region $R_3$ as shown by dotted lines in FIG. 1. In FIGS. 9A through 9D solid lines show impurity concentration distributions and dotted lines show the electric field distributions in a range from the PN junction (x = 0) to x = W to which the depletion layer width extends. For this reason, the layer $P_4$ having a graded impurity concentration is not shown in these drawings.

Figure 10:
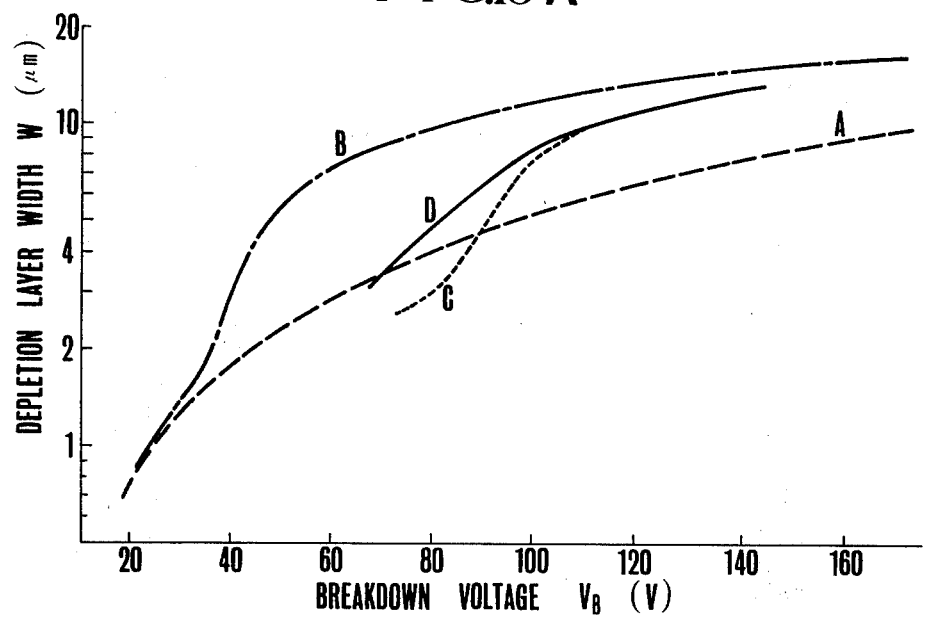
FIG. 10A is a graph showing the relationship between the depletion layer width of a diode having characteristics shown in FIGS. 9A through 9D and the breakdown voltage.
FIG. 10B shows the relationship between the effective ionization coefficient ratio and the breakdown voltage of a photodiode having characteristics shown in FIGS. 9A through 9D.
Figure 10:
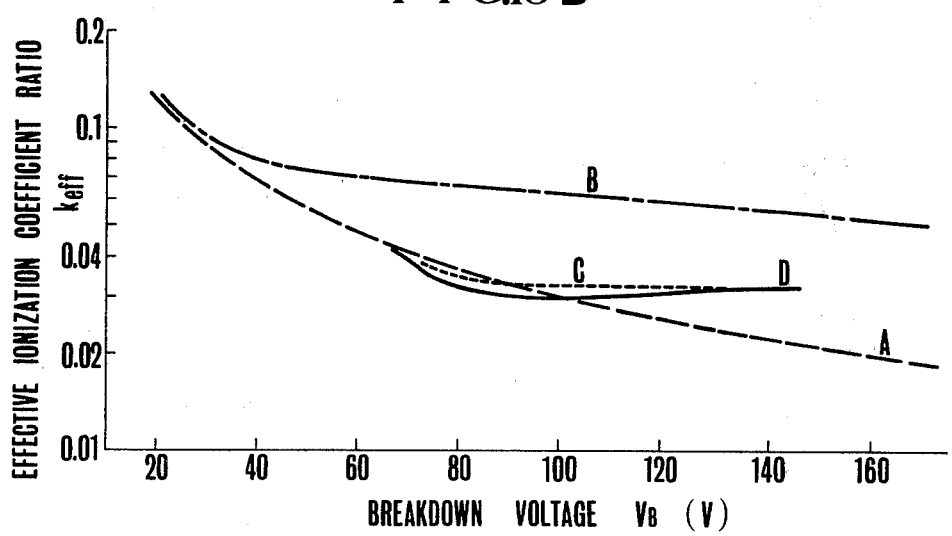

When the impurity concentration in a region contiguous to the junction is constant as shown in FIG. 9A, the electric field distribution varies linearly, so that it is possible to obtain the width of the depletion layer of 5 microns for a breakdown voltage of 100V and of about 10 microns for a breakdown voltage of 160V as can be noted from the characteristic curve A shown in FIG. 10A. Since the light absorption coefficient of silicon is about 600 cm$^{-1}$ at a wavelength of 0.85 microns, in order to obtain a response speed to frequencies up to about 1GHz with a quantum efficiency of higher than 60%, it is necessary to make the width of the depletion layer to be about 20 microns. As a consequence, the breakdown voltage should be higher than 200V. The noise characteristic of such diode is shown by curve A in FIG. 10B. In contrast in the prior art diode shown in FIG. 9B and including hyperabrupt junction for the purpose of increasing the depletion layer width at low voltages, the high field intensity region utilized to provide the avalanche multiplication is limited only in a narrow region adjacent the junction thereby decreasing the field intensity in the depletion layer other than the avalanche region. As a consequence, as shown by curve B in FIG. 10A, when compared with the diode having a structure shown in FIG. 9A under the same breakdown voltage it is possible to increase the depletion layer width by a factor of more than 2. Generally, however, in an avalanche photodiode the noise created during the avalanche multiplication process is closely related to the field intensity of the avalanche multiplication region. In silicon, for example the noise increases with the field intensity. The magnitude of the noise can be expressed by the parameter $k_{eff}$ and the noise decreases with the value of this parameter. This phenomenon is reported by Robert J. McIntyre in a paper "The distribution of gains in uniformly multiplaying avalanche photodiodes : Theory", I.E.E.E. Transaction on Electron Devices, Vol. ED-19, No. 6, pp. 703–713, June 1972. FIG. 10B shows that the diode having a structure shown in FIG. 9B has inferior noise characteristic than the diode having a structure shown in FIG. 9A.

As can be clearly noted from the foregoing description, in the prior art avalanche photodiode, if one tries to simultaneously improve the photoelectric conversion efficiency, that is the quantum efficiency, noise characteristic and response speed it is necessary to increase the operating voltage.

On the contrary, considering the photodiode of this invention shown in FIGS. 9C and 9D, as can be noted from curves shown in FIGS. 10A, the structure shown in FIGS. 9C and 9D are not comparable with that of FIG. 9B but can form a depletion layer having a length 1.6 times of that of the structure at 100V shown in FIG. 9A, that is 8 micron. Further, the noise parameter $k_{eff}$ is about 0.03 in each case thus giving substantially the same noise characteristics as the structure shown in FIG. 9A.

In the structure shown in FIG. 9D, the intensity and distribution of the field in the avalanche region are varied so as to optimize the noise. This structure can increase the depletion layer width than the structure shown in FIG. 9C at a breakdown voltage of less than about 100V. Also the noise characteristic is improved over that of FIG. 9C.

The characteristics of the novel diode of this invention obtained by calculation can be demonstrated by experiment. At first the pulse response characteristic will be considered. FIGS. 11A and 11B respectively shows the pulse response characteristics of a prior art photodiode not provided with a region formed with the impurity concentration gradient, that is the region $P_4$ in FIG. 1 and the diode of this invention provided with the region $P_4$. These characteristics show the pulse response waveforms where the multiplication factor M = 100. As shown in FIG. 11A, in the diode not provided with the impurity concentration gradient pulse trailing edge after the peak is long whereas in the diode of this invention this long trailing edge is greatly improved thus providing a sharp pulse response characteristic with sharp leading and trailing edge as shown in FIG. 11B.

Even in the diode of this invention with the impurity concentration gradient when the impressed voltage is low the depletion layer does not extend sufficiently with the result that the depletion layer field and the built-in field will be discontinuous thereby resulting in a long trailing edge characteristic as shown in FIG. 12A. For this reason, the diode of this invention also requires an impressed voltage (about 100V) above a certain value. FIG. 12B shows the pulse response waveform of the diode of this invention where 100V is applied. The half value width of the pulse response waveforms of the diodes of this invention shown in FIGS. 11B and 12B is about 250 psec, and the 10% width of the pulse of the peak is 600 to 700 psec. These values show that the diode of this invention is applicable to high speed pulses of faster than 1 Gbit/sec with a small intersymbol interference.

FIG. 13 is a graph showing the relationship between the magnitude of noise and the multiplication factor M in which the ordinate shows the excess noise factor F in dB. These measured values coincide well with the calculated values shown in FIG. 10B and the value of parameter $k_{eff}$ is 0.03 to 0.04. These values are comparable with those obtained in the prior art diode having a breakdown voltage of 150 to 200V or more. In FIG. 13, a curve shown by white small circles represents a diode with an impurity concentration distribution shown in FIG. 9C while a curve shown by black small circles represents a diode with an impurity concentration distribution shown in FIG. 9D. A solid curve was obtained by McIntyre's equation $F = M[1 - (1 - k)(M - 1)^2/M^2]$ where $K = \beta/\alpha$, $\alpha$ represents the ionization coefficient of electrons and that of holes. This equation is discussed in detail in the above cited paper of R. J. McIntyre.

The following table shows various characteristics of the diodes having structure shown in FIGS. 9A through 9D under the same breakdown voltage $V_B = 100V$. The wavelength of the light was 0.85 micron.

Table

|  | Diode of FIG. 9A | Diode of FIG. 9B | Diode of FIG. 9C | Diode of FIG. 9D |
|---|---|---|---|---|
| Depletion layer width (μm) | 5 | 11 | 8 | 8 |
| Frequency band | 0.15GHz * | 0.28GHz * | 1.7GHz ** | 1.7GHz ** |
| Quantum efficiency | 26% *** | 48% *** | 66% ** | 66% ** |
| $k_{eff}$ | 0.03 | 0.06 | 0.04 | 0.03 |
| Minimum receiving level **** | −44.0dBm | −45.5dBm | −47.6dBm | −48.1dBm |

\* defined by the depletion layer width and the width of the diffused region
\*\* defined by the depletion layer width and the width of the built-in field region
\*\*\* defined by the depletion layer width
\*\*\*\* bite rate — 100 M bit/sec digit error rate — $10^{-9}$ As this clearly shows the diodes of this invention shown in FIGS. 9C and 9D have greatly improved overall characteristics in comparsion to the prior art diodes shown in FIGS. 9A and 9B, that is the avalanche diodes of this invention have higher quantum efficiency, faster response speed and better noise characteristic at a relatively low applied voltage.

It should be understood that the invention is not limited to the specific embodiments described above and that many changes and modifications will be obvious to one skilled in the art. For example, the P type regions and N type regions of the embodiments may be substituted by N type regions and P type regions, respectively. Further, the invention is also applicable to semiconductor photodiodes having a so called Schottky barrier junction wherein either one of the regions that form a junction is substituted by a metal layer. Further, instead of providing a region $P_3$ in which the impurity concentration is low between region $P_2$ in which the impurity concentration is high and region $P_4$ in which the impurity concentration varies, the region $P_3$ may be omitted in which case regions $P_2$ and $P_4$ become contiguous.

Instead of providing an impurity concentration gradient for the region $P_4$ alone, such gradient can also be provided for all regions $P_3$, $P_4$ and $P_5$.

Although in the illustrated embodiment the impurity concentration was gradually decreased from regions $P_5$ toward the junction where a P type region (in the embodiment, region $P_3$) is formed between the junction and the region $P_4$ having the concentration gradient, a region in which the impurity concentration varies stepwisely may be provided between them. In the same manner such region in which the impurity concentration varies stepwisely can also be provided between regions $P_4$ and $P_5$.

Instead of using silicon for fabricating the semiconductor substrate, germanium or III-V compounds such as GaAs, InGaAs, GaAsSb, InGaAsP, InAs, InP, GaSb can also be used. Although light was projected upon the main surface of the diode, it is also possible to project from the opposite side. In this case an N+ substrate is prepared and $P_1$, $P_2 \ldots P_5$ regions are successively formed on the substrate by epitaxial growth technique in the order mentioned.

What is claimed is:

1. A semiconductor photodiode of the type including a junction between semiconductor regions containing impurities of different conductivity types and wherein photo-electric conversion is effected by utilizng the avalanche multiplication phenomena of carriers; one of said regions comprising first, second, third and fourth contiguous zones, said first zone being contiguous to said junction and containing a first conductivity type impurity at a relatively low concentration relative to said second zone, and said second zone being contiguous to said first zone on the side thereof opposite said junction and containing said first conductivity type impurity at a substantially higher concentration than the impurity concentration of said first zone, said third zone being contiguous to said second zone on the side thereof opposite said first zone and containing said first conductivity type impurity with the impurity concentration in said third zone being lower than the impurity concentration of said second zone at the intersection of the second and third zones and with the impurity concentration of said third zone gradually increasing to a substantially higher concentration in a direction away from the intersection of the second and third zones to thereby form an impurity concentration gradient, and said fourth zone being contiguous to said third zone on the side thereof opposite said second zone and containing said first conductivity type impurity at the substantially higher concentration.

2. The photodiode according to claim 1 wherein in the presence of a reverse bias field the first zone is connected to the third zone through the high impurity concentration second zone which serves to rapidly decrease the field intensity across the third zone and the impurity concentration gradient formed across the third zone creates a built-in-field for accelerating carriers formed in the fourth zone toward the junction for collection.

3. The photodiode according to claim 1 wherein said junction comprises a PN junction and said first type impurity is of the P type conductivity.

4. The photodiode according to claim 3 wherein the region on the side of said junction opposite said first zone is of the N conductivity type and surrounded by an annular guard ring.

5. The photodiode according to claim 1 which further comprises an intermediate zone containing an impurity at a constant and relatively low concentration disposed between said second and third zones.

6. The photodiode according to claim 5 wherein the impurity concentration varies stepwisely at the interface between said intermediate zone and said third zone.

7. The photodiode according to claim 5 wherein the impurity concentration is higher in said first zone than in said intermediate zone.

8. A semiconductor photodiode of the type including a junction between a metal layer and a semiconductor region to form a Schottky barrier and wherein the semiconductor region contains a plurality of contiguous zones of the same conductivity type impurity but differing concentrations and photo-electric conversion is effected by utilizing the avalanche multiplication phenomena of carriers; said semiconductor region comprising first, second, third and fourth zones, said first zone being contiguous to said junction and containing a first conductivity type impurity at a relatively low concentration relative to said second zone, said second zone being contiguous to said first zone on the side thereof opposite said junction and containing said first conductivity type impurity at a substantially higher concentration than the impurity concentration of said first zone, said third zone being contiguous to said second zone on the side thereof opposite said first zone and containing said first conductivity type impurity with the impurity concentration in said third zone being lower than the impurity concentration of said second zone at the intersection of the second and third zones and with the impurity concentration of said third zone gradually increasing to a substantially higher concentration in a direction away from the intersection of the second and third zones to thereby form an impurity concentration gradient, and said fourth zone being contiguous to said third zone on the side thereof opposite said second zone and containing said first conductivity type impurity at the substantially higher concentration.

9. The photodiode according to claim 1 wherein the impurity concentration varies stepwisely at the interface between said third and fourth zones.

* * * * *